US011022491B2

(12) United States Patent
Riel et al.

(10) Patent No.: US 11,022,491 B2
(45) Date of Patent: Jun. 1, 2021

(54) COMPACT, POWER-EFFICIENT STACKED BROADBAND OPTICAL EMITTERS

(71) Applicant: ams Sensors Singapore Pte. Ltd., Singapore (SG)

(72) Inventors: Peter Riel, Bach (CH); Peter Roentgen, Thalwil (CH)

(73) Assignee: ams Sensors Singapore Pte. Ltd, Singapore (SG)

( * ) Notice: Subject to any disclaimer, the term of this patent is extended or adjusted under 35 U.S.C. 154(b) by 0 days.

(21) Appl. No.: 16/848,126

(22) Filed: Apr. 14, 2020

(65) Prior Publication Data
US 2020/0249087 A1    Aug. 6, 2020

Related U.S. Application Data

(63) Continuation of application No. 15/512,977, filed as application No. PCT/SG2015/050335 on Sep. 23, 2015, now Pat. No. 10,656,014.
(Continued)

(51) Int. Cl.
*G01J 3/10* (2006.01)
*H01S 5/04* (2006.01)
(Continued)

(52) U.S. Cl.
CPC . *G01J 3/10* (2013.01); *G01J 3/06* (2013.01); *G01J 3/108* (2013.01); *G01J 3/26* (2013.01);
(Continued)

(58) Field of Classification Search
CPC ...................................................... G01J 3/10
(Continued)

(56) References Cited

U.S. PATENT DOCUMENTS 5,343,487 A * 8/1994 Scott .................... H01S 5/18333
                                                      372/45.01
5,684,309 A   11/1997 McIntosh et al.
(Continued)

FOREIGN PATENT DOCUMENTS

CN            1710764 A     12/2005
CN          102473817 A      5/2012
(Continued)

OTHER PUBLICATIONS

Ansbaek, "Vertical-cavity surface-emitting lasers for medical diagnoses", Department of Photonics Engineering at the Technical University of Denmark, PhD Dissertation, 95 pages, 2012.
(Continued)

*Primary Examiner* — Tarifur R Chowdhury
*Assistant Examiner* — Omar H Nixon
(74) *Attorney, Agent, or Firm* — Michael Best and Friedrich LLP (57) ABSTRACT

The present disclosure describes broadband optical emission sources that include a stack of semiconductor layers, wherein each of the semiconductor layers is operable to emit light of a different respective wavelength; a light source operable to provide optical pumping for stimulated photon emission from the stack; wherein the semiconductor layers are disposed sequentially in the stack such that a first one of the semiconductor layers is closest to the light source and a last one of the semiconductor layers is furthest from the light source, and wherein each particular one of the semiconductor layers is at least partially transparent to the light generated by the other semiconductor layers that are closer to the light source than the particular semiconductor layer. The disclosure also describes various spectrometers that include a broadband optical emission device, and optionally include
(Continued)

a tuneable wavelength filter operable to allow a selected pass through.

4 Claims, 12 Drawing Sheets

Related U.S. Application Data (60) Provisional application No. 62/088,932, filed on Dec. 8, 2014, provisional application No. 62/053,909, filed on Sep. 23, 2014.

(51) Int. Cl.

| | | |
|---|---|---|
| *H01S 5/183* | (2006.01) | |
| *H01S 5/40* | (2006.01) | |
| *G01J 3/06* | (2006.01) | |
| *G01J 3/26* | (2006.01) | |
| *H01S 5/00* | (2006.01) | |
| *H01S 5/10* | (2021.01) | |
| *H01S 5/343* | (2006.01) | |
| *H01S 3/094* | (2006.01) | |
| *H01S 5/323* | (2006.01) | |
| *H01S 5/028* | (2006.01) | |

(52) U.S. Cl.
CPC ............ *H01S 5/0071* (2013.01); *H01S 5/041* (2013.01); *H01S 5/1096* (2013.01); *H01S 5/183* (2013.01); *H01S 5/34326* (2013.01); *H01S 5/4043* (2013.01); *H01S 3/094096* (2013.01); *H01S 5/0287* (2013.01); *H01S 5/32375* (2013.01); *H01S 5/3438* (2013.01); *H01S 5/34306* (2013.01); *H01S 5/34313* (2013.01); *H01S 5/4087* (2013.01)

(58) Field of Classification Search
USPC ........................................................ 356/420
See application file for complete search history.

(56) References Cited

U.S. PATENT DOCUMENTS

| | | | |
|---|---|---|---|
| 5,780,867 | A | 7/1998 | Fritz et al. |
| 6,657,278 | B2 | 12/2003 | Lee |
| 6,658,172 | B1 | 12/2003 | Scobey et al. |
| 7,224,041 | B1 | 5/2007 | Sherohman et al. |
| 7,479,731 | B2 | 1/2009 | Udagawa |
| 8,436,351 | B2 | 5/2013 | Yamamuro et al. |
| 8,575,471 | B2 | 11/2013 | Norman et al. |
| 8,722,433 | B2 | 5/2014 | Yen |
| 8,749,130 | B2 | 6/2014 | Paree et al. |
| 8,772,623 | B2 | 7/2014 | Wanlass et al. |
| 2002/0024989 | A1* | 2/2002 | Coldren .............. H01S 5/18341 372/96 |
| 2002/0171834 | A1 | 11/2002 | Rowe et al. |
| 2003/0043877 | A1 | 3/2003 | Kaspi |
| 2005/0067627 | A1 | 3/2005 | Shen et al. |
| 2006/0098194 | A1 | 5/2006 | Tuschel |
| 2007/0070347 | A1 | 3/2007 | Scherer et al. |
| 2008/0232416 | A1 | 9/2008 | Okamoto et al. |
| 2011/0266470 | A1 | 11/2011 | Yun et al. |
| 2012/0097921 | A1 | 4/2012 | Smith et al. |
| 2012/0263204 | A1 | 10/2012 | Hashimoto et al. |
| 2012/0286701 | A1 | 11/2012 | Yang et al. |
| 2013/0016973 | A1 | 1/2013 | Zheng et al. |
| 2014/0084296 | A1 | 3/2014 | Yoshida et al. |
| 2014/0117396 | A1 | 5/2014 | Eisert et al. |
| 2014/0151575 | A1 | 6/2014 | Hillmer et al. |
| 2014/0218741 | A1 | 8/2014 | Johnson et al. |
| 2015/0043002 | A1 | 2/2015 | Kuznetsov et al. |

FOREIGN PATENT DOCUMENTS

| | | |
|---|---|---|
| CN | 103048293 A | 4/2013 |
| EP | 0086008 A2 | 8/1983 |
| EP | 1608049 A1 | 12/2005 |

OTHER PUBLICATIONS

Davani, "High-SpeedTunable Short-Wavelength VCSEL for Opitcal Interconnects", Dem Fachbereich Elektrotechnik und Informationstechnik der Technischen Universitat Darmstadt zur Erlangung des akademischen Grades eines, submitted Apr. 22, 2014, published 2015, 134 pages.

Fritz et al, "Broad-band light-emitting diode for 1.4-2.0 urn using variable-composition InGaAs quantum wells", Photonics Technology Letters, vol. 7, No. 11, 1995.

Gierl et al, "Surface mircomachined tunable 1.55um-VCSEL with 102 nm continuous single-mode tuning", Optics Express, vol. 19, No. 18, p. 17336, 2015.

International Search Report for Application No. PCT/SG2015/050335 dated Jan. 25, 2016 (5 pages).

Jayaraman et al., "High-Speed Ultra-Broad Tuning MEMS-VCSELS for Imaging and Spectroscopy", Smart Sensors, Actuators and MEMS VI, May 17, 2013.

Keller et al., "8.5 W VECSEL output at 1270 nm with conversion efficiency of 59%", Optics Express, vol. 23, No. 13, Jun. 2015.

Liu et al., "A review of MEMS external-cavity tunable lasers", Journal of Micromechanics and Microengineering, vol. 17, No. 1, Dec. 2006.

Setlur, "Phosphors for LED-based Solid-State Lighting", The Electrochemical Society Interface, pp. 32-36, Winter 2009.

Sirbu et al., "Recent progress in wafer-fused VECSELs emitting in the 1310 nm and 1550 nm bands", Vertical External Cavity Surface Emitting Lasers 9VECSELs III, vol. 8606, 12 pages, 2013.

Taleb et al., "VCSEL Based on InAs Quantum-Dashes With a Lasing Operation Over a 117-nm Wavelength Span", IEEE Photonics Technology Letters, Institute of Electrical and Electronics Engineers, vol. 25, No. 21, pp. 2126-2128, 2013.

The State Intellectual Property Office of the People's Republic of China, English translation of Office Action issued in Chinese Application No. 201580051492.X, dated Nov. 28, 2018 (10 pages).

\* cited by examiner

| | InP Cap | $In_xGa_{(1-x)}As$ | InP Barrier | $In_xGa_{(1-x)}As$ | InP Barrier | $In_xGa_{(1-x)}As$ | InP Barrier | $In_xGa_{(1-x)}As$ | InP Barrier | $In_xGa_{(1-x)}As$ | InP Barrier |
|---|---|---|---|---|---|---|---|---|---|---|---|
| x: | | 15% | | 23% | | 32% | | 40% | | 48% | |
| Eg [eV] | 1.345 | 1.192 | 1.345 | 1.078 | 1.345 | 0.976 | 1.345 | 0.886 | 1.345 | 0.800 | 1.345 |
| Lam Eg [nm] | 922 | 1040 | 922 | 1150 | 922 | 1270 | 922 | 1400 | 922 | 1550 | 922 |

| InP Barrier | $In_xGa_{(1-x)}As$ | InP Barrier | $In_xGa_{(1-x)}As$ | InP Barrier | $In_xGa_{(1-x)}As$ | InP Barrier |
|---|---|---|---|---|---|---|
| | 55% | | 62% | | 70% | |
| 1.345 | 0.729 | 1.345 | 0.660 | 1.345 | 0.500 | 1.345 |
| 922 | 1700 | 922 | 1880 | 922 | 2100 | 922 |

COMPACT, POWER-EFFICIENT STACKED BROADBAND OPTICAL EMITTERS

CROSS-REFERENCE TO RELATED APPLICATION(S)

This application is a Continuation Application of U.S. patent application Ser. No. 15/512,977, filed Mar. 21, 2017, which is National Stage Entry of International Application No. PCT/SG2015/050335, filed Sep. 23, 2015, which claims the benefit of priority of U.S. Provisional Patent Application No. 62/053,909 filed on Sep. 23, 2014 and U.S. Provisional Patent Application No. 62/088,932 filed on Dec. 8, 2014. The disclosures of the earlier applications are incorporated herein by reference in their entirety.

FIELD OF THE DISCLOSURE

The present disclosure relates to compact, power-efficient stacked broadband optical emitters.

BACKGROUND

Spectrometers and other optoelectronic devices can be used, for example, to determine various characteristics or an object based on the wavelengths of light reflected by, transmitted through and/or absorbed by the object. Such devices may employ a broadband light emission source. In some cases, it is desirable for the broadband light source to be operable to emit light not only in the visible and mid infra-red (IR) parts of the spectrum, but also in the near IR part of the spectrum (e.g., 800-2500 nm). Some known techniques for providing such broadband light emission sources tend to be bulky, consume significant amounts of energy and/or are relatively costly.

Generally speaking, a layered stack including multiple layers (each with different band gaps) can be operable to emit light from each of the layers by injecting charge carriers into the stack via electrodes. The charge carriers (e.g., electrons) must make their way to each layer in order to combine with a complementary charge carrier (e.g., holes), wherein the electrons and holes emit light upon combination. As a result, a configuration that requires charge-carrier injection tends to impose a number of restrictions. For example, to enable charge-carrier injection, each layer in the stack must not exceed a certain thickness. This restriction on the thickness imposes, in turn, a restriction on the allowable composition of light emitted by such a layered stack. For example, the layers are often implemented as quantum wells, and the thickness of the quantum well dictates to a large degree the wavelength of light emitted by it. Thus, optimization of charge-carrier injection leads to restrictions on the wavelengths of light that can be emitted by a layered stack relying on charge-carrier injection. Further, in such a layered stack, each layer must be comprised of a material generally amenable to charge-carrier transport, which generally can be achieved via doping. Doping, however, tends to decrease the radiative-recombination efficiency. Further, electrical contacts (e.g., electrodes) must be made to such a layered stack.

SUMMARY

The present disclosure describes broadband optical emission sources based on photon injection/light pumping instead of charge-carrier injection. The broadband optical emission sources include a stack of light emitting materials with different compositions and/or quantum layer thicknesses to generate a multi-emission spectrum within a single semiconductor device. Such broadband emitters can, in some implementations, be relatively compact and can be operable to emit over a wide emission spectra, including near-IR.

For example, in one aspect, a broadband optical emission device includes a stack of semiconductor layers, wherein each of the semiconductor layers is operable to emit light of different respective wavelength. A light source is operable to provide pumping for stimulated photon emission from the stack. The semiconductor layers are disposed sequentially in the stack such that a first one of the semiconductor layers is closest to the light source and a last one of the semiconductor layers is furthest from the light source. Each particular one of the semiconductor layers is at least partially transparent to the light generated by the other semiconductor layers that are closer to the light source than the particular semiconductor layer.

Various implementations include one or more of the following features. For example, at least some of the light generated by each particular one of the semiconductor layers, other than the last semiconductor layer, can provide pumping for stimulated photon emission from other semiconductor layers that are further from the light source. In some cases, each of the semiconductor layers has a respective band gap energy, and the semiconductor layers are in the stack such that the semiconductor layer having the highest bandgap energy is closest to the light source. In some instances, each of the semiconductor layers has a respective band gap energy, and the semiconductor layers are in the stack such that the semiconductor layer having the lowest bandgap energy is closest to the light source.

In some implementations, the device includes one or more transition layers each of which provides a smooth transition in lattice constant between the semiconductor layers in the stack. Each particular one of the one or more transition layers can be at least partially transparent to the light generated by the semiconductor layers that are closer to the light source than the particular transition layer.

In some cases, the light source is operable to emit light of a wavelength less than wavelengths of light emitted by the semiconductor layers. A partially reflective layer and/or a distributed feedback element can be provided and can be operable to allow some of the light to pass to outside the broadband emission device and to reflect some of the light back into the stack so as to generate further stimulated optical emission from one or more of the semiconductor layers. In some instances, a reflector is provided to reflect stray light away from the stack of semiconductor layers. The light source can comprise, for example, at least one of a light emitting diode, a laser diode, or a vertical cavity surface emitting laser (VCSEL) operable to emit light at an energy higher than a band-gap energy of any of the semiconductors layers.

The disclosure also describes various spectrometers, which may include a broadband optical emission source. Various arrangements are described in greater detail below.

Employing photon injection/light pumping instead of charge-carrier injection can provide a number of degrees of freedom so as to enable highly customized emission (i.e., any wavelength composition and/or intensity composition desired). For example, the layer thicknesses can be customized. In principle, the layers need not rely on doping to achieve various band gaps; the layer material can, in some cases, be a pure/solid-solution semiconductor, wherein radiative recombination efficiency can be higher than in heavily doped semiconductors. The present techniques can, in some cases, provide greater flexibility in terms of intermediate layers (e.g., barrier layers). For example, barrier layers can be particularly transparent to the light (i.e., having a rather large band gap), while in other implementations the barrier layers can be partially absorbing.

Other advantages can be provided in some implementations. For example, electrical contacts are not needed because electron-hole pairs are introduced via light pumping which relies on optical coupling. Further, optical coupling to the layered stack can be more desirable in some implementations because it does not require additional electrode compatible surfaces. Other variations in the orientation of the stack with respect to the light source can be implemented as well.

In some implementations, multiple light sources can be included e.g., one on each side perpendicular to the light-emitting layers. For example, a number of light sources can be included, each with a different wavelength. Thus, two light sources each of which is configured to emit a high-energy wavelength and a low-energy wavelength can increase efficiency in some implementations.

Other aspects, features and advantages will be readily apparent from the following detailed description, the accompanying drawings, and the claims.

DETAILED DESCRIPTION

Figure 1:
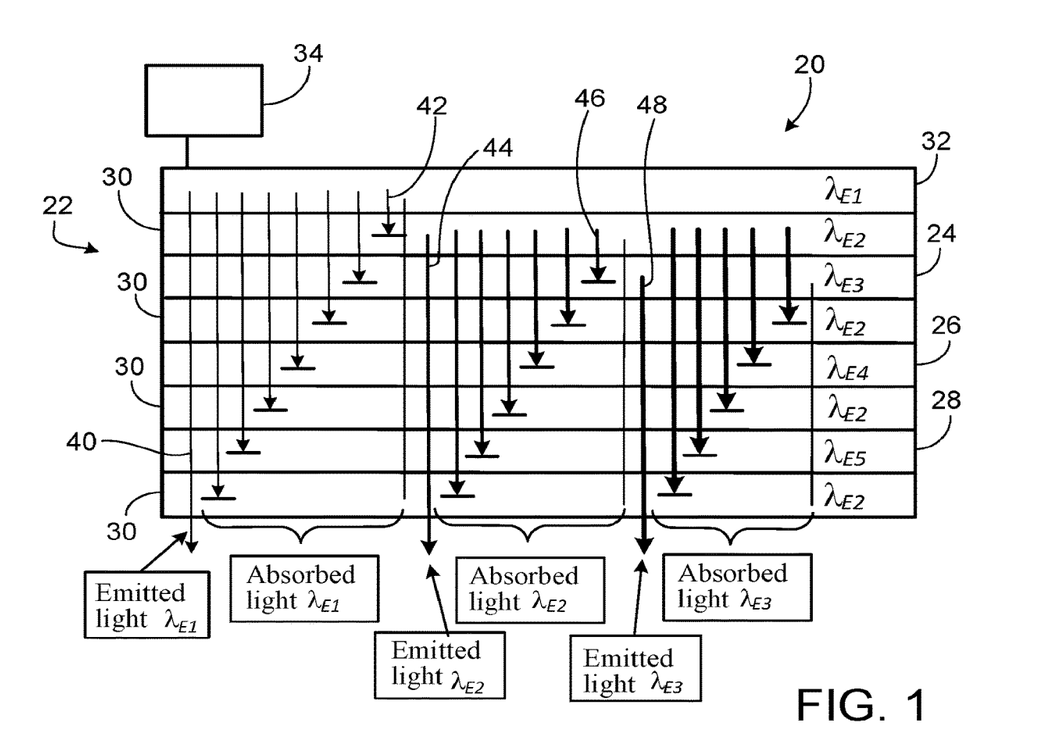
FIG. 1 illustrates an example of a broadband emission device.

As shown in FIG. 1, a broadband emission device 20 includes a stack 22 of light emitting semiconductor layers 24, 26, 28 with different compositions and/or quantum layer thicknesses to generate a multi-emission spectrum. In some implementations, one or more transition or barrier layers 30 help provide a smooth transition in lattice constant from one layer to the next. The transition layers 30 thus can help reduce strain that otherwise might occur and can help provide mechanical transitions. In some implementations, some or all of the transition layers 30 may be omitted.

The broadband emission device 20 also includes a light source 32 driven by an external power source 34. As discussed below, the light source 32 may be implemented in various ways, but in general, provides a pumping mechanism for generating electron-holes pairs that can result in radiative recombination so as to stimulate photon emission from the layers 24-30. The stack 22 of light emitting layers can be deposited or grown epitaxially, for example, on a substrate 38 (see FIG. 1A) by standard semiconductor deposition and growth techniques such as Molecular Beam Epitaxy (MBE), Metal Organic Chemical Vapor Deposition (MOCVD), Organo Metallic Vapor Phase Epitaxy (OMVPE), or other techniques.

Figure 1A:
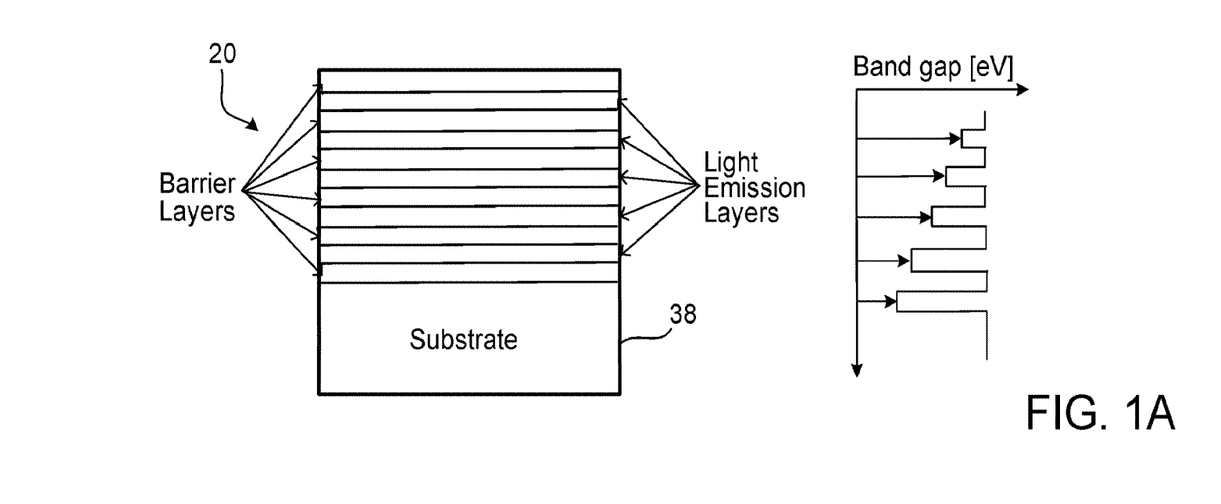
FIG. 1A illustrates an example of epitaxially grown layers for a broadband emission device.

The light source 32 generates light of wavelength $\lambda_{E1}$, which corresponds to an energy level E1. Likewise, each of the layers 24-30 has a respective band gap energy, which corresponds to a particular wavelength. In particular, each of the light emitting layers 24, 26, 28 has a respective band gap energy E3, E4, E5, corresponding respectively to wavelengths $\lambda_{E3}$, $\lambda_{E4}$, $\lambda_{E5}$, and the transition layers 30 have a band gap energy E2, corresponding to a wavelength $\lambda_{E2}$. In the example of FIG. 1, the compositions of the layers 24-30 are selected such that the band gap energy levels have the following relationship: E1>E2>E3>E4>E5. Thus, the wavelengths of photons emitted by the light source 32 and the various layers 24-30 have the following relationship: $\lambda_{E1}<\lambda_{E2}<\lambda_{E3}<\lambda_{E4}<\lambda_{E5}$. FIG. 1A illustrates such a scenario schematically.

In operation, when the light source 32 is driven by the external power source 34, the light source 32 emits light of the first wavelength $\lambda_{E1}$. The light of wavelength $\lambda_{E1}$ emitted by the light source 32 is partially transmitted through and partially absorbed by each of the layers 24-30. The light of wavelength $\lambda_{E1}$ absorbed by the other layers 24-30 stimulates emission of light from each of the subsequent layer 24-30. Further the stimulated light subsequently emitted from each layer 24-30 is partially transmitted through and partially absorbed by subsequent layers in the stack 22. Partial transmission and absorption of the wavelengths $\lambda_{E1}$, $\lambda_{E2}$, $\lambda_{E3}$, $\lambda_{E4}$, $\lambda_{E5}$ can be achieved by adjusting material parameters, including the thickness of all layers. Thus, in FIG. 1, arrow 40 indicates light at wavelength $\lambda_{E1}$ that is emitted by the light source 32 and passes completely through the stack 22. Arrow 42 indicates light $\lambda_{E1}$ emitted by the source 32 that is absorbed by one of the transitional layers 30. Arrow 44 indicates stimulated emission of light) $\lambda_{E2}$ that passes completely through the stack 22. Arrow 46 indicates stimulated emission of light $\lambda_{E2}$ that is absorbed by layer 24. Arrow 48 indicates stimulated emission of light $\lambda_{E3}$ that passes completely through the stack 22. Stimulated emission of light between other the layers is omitted from FIG. 1 for the sake of clarity.

Figure 1B:
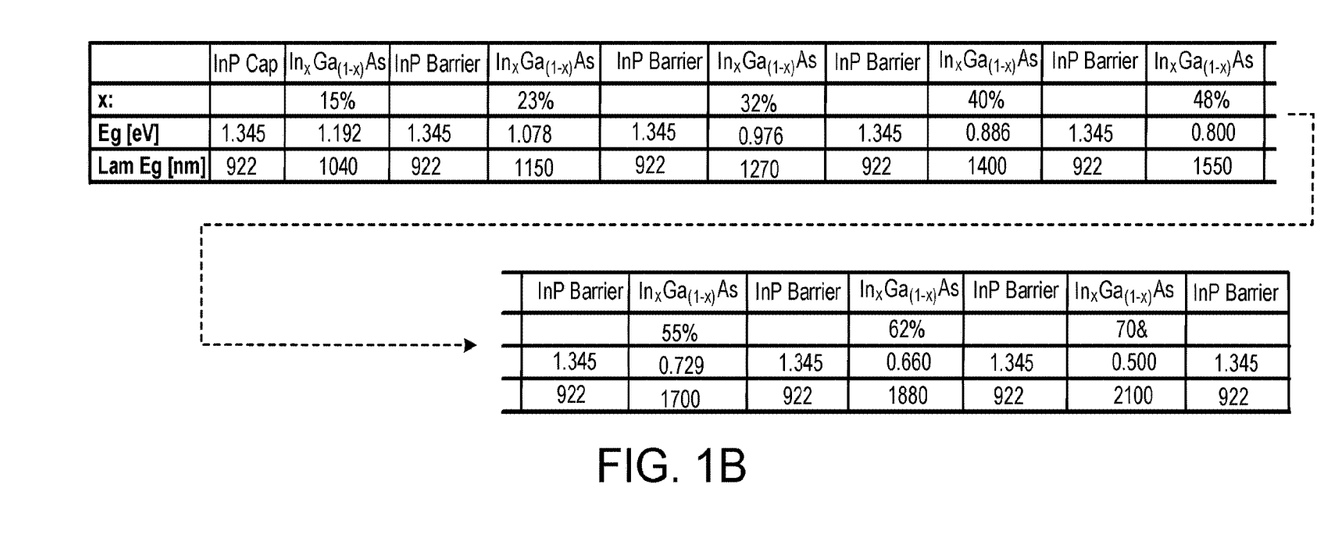
FIG. 1B illustrates an example of details of the layers for a broadband emission device.

In a particular implementation, the stack 22 is a strained gallium indium arsenide (GaInAs) system including indium phosphide (InP) transition or barrier layers. An example of the sequence of layers in the stack for such an implementation is illustrated in FIG. 1B and can provide an emission spectrum at room temperature over a range of about 1000 nm wide (e.g., from about 1000 nm to about 2100 nm). Other III-V compound semiconductor (e.g., AlGaInAsP, lattice matched to InP) or organic semiconductor materials can be used as well. In some cases, the layers 24-30 have a thickness on the order of about 30 nm. The composition and thickness of the layers 24-30 may differ in other implementations. Likewise, the number of light emitting layers may differ in some implementations. The composition and thickness of the quantum and transitional layers may differ in other implementations. Likewise, the number of light emitting layers may differ in some implementations.

In some instances, each of the layers 24, 26, 28 is a semiconductor quantum layer. The band gap of each layer can be tuned by adjusting its quantum layer thickness. In some instances, each of the quantum layers has a thickness for example, in the range of 4-6 nm. In some cases, the stack 22 can be implemented by $Ga_xIn_{1-x}As_yP_{1-y}$ quantum layers, lattice matched by InP transitional layers.

Figure 1C:
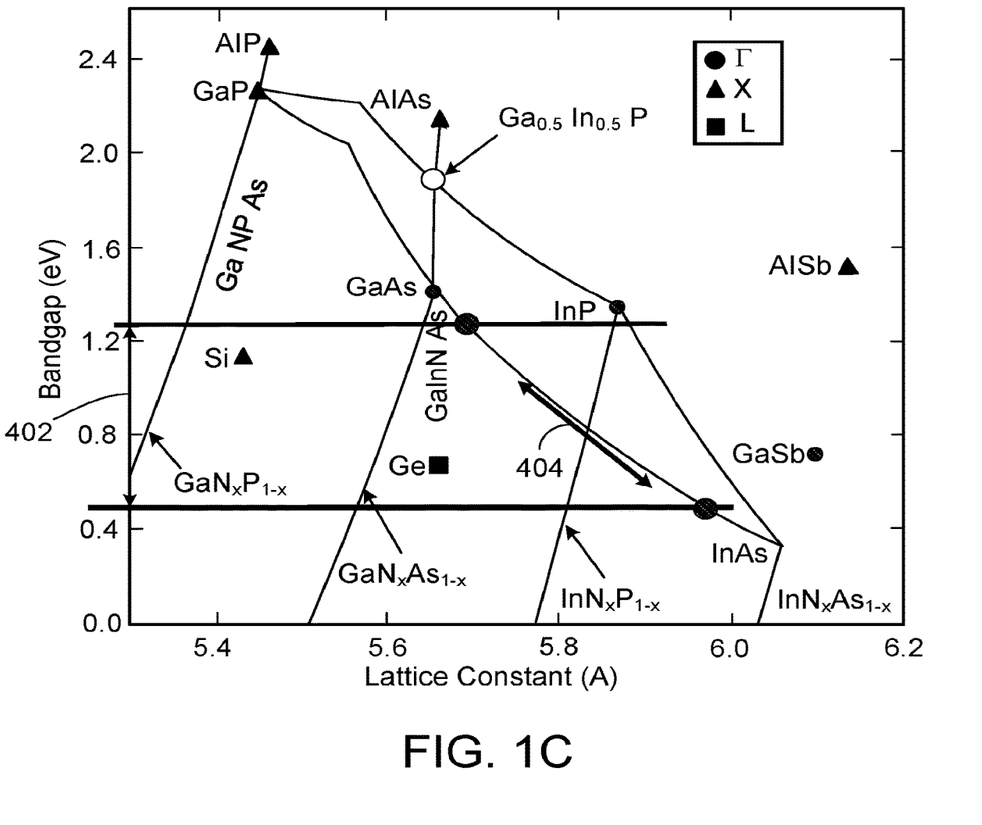
FIG. 1C illustrates a graph showing band gap energy versus lattice constant for various semiconductor materials.

FIG. 1C is a graph illustrating how band gap (eV) varies with lattice constant (Å) for certain compound semiconductor systems. As will be readily understood by a person of ordinary skill in the art, such a graph can facilitate selection the appropriate semiconductor materials for the light emitting layers (e.g., 24, 26, 28) and the transition layers 30 (if any). First, a range of desired emission wavelengths, correlated with band-gap range, can be chosen. See 402 in FIG. 1C. Next, an appropriate semiconductor system (e.g., GaAs—InAs) is identified for the chosen band gap range. For the GaAs—InAs system, variations in In and Ga control the band-gap. See line 404 in FIG. 1C. Next, a suitable material is identified for the transitional layers. For example, for the GaAs—InAs system, the variation of lattice parameter with substitution of In and Ga is approximately centered around InP. Thus, InP can provide a suitable material for the transitional layers. Accordingly, other semiconductor systems (e.g., III-V compound semiconductor materials) can be used in some implementations.

Figure 1D:
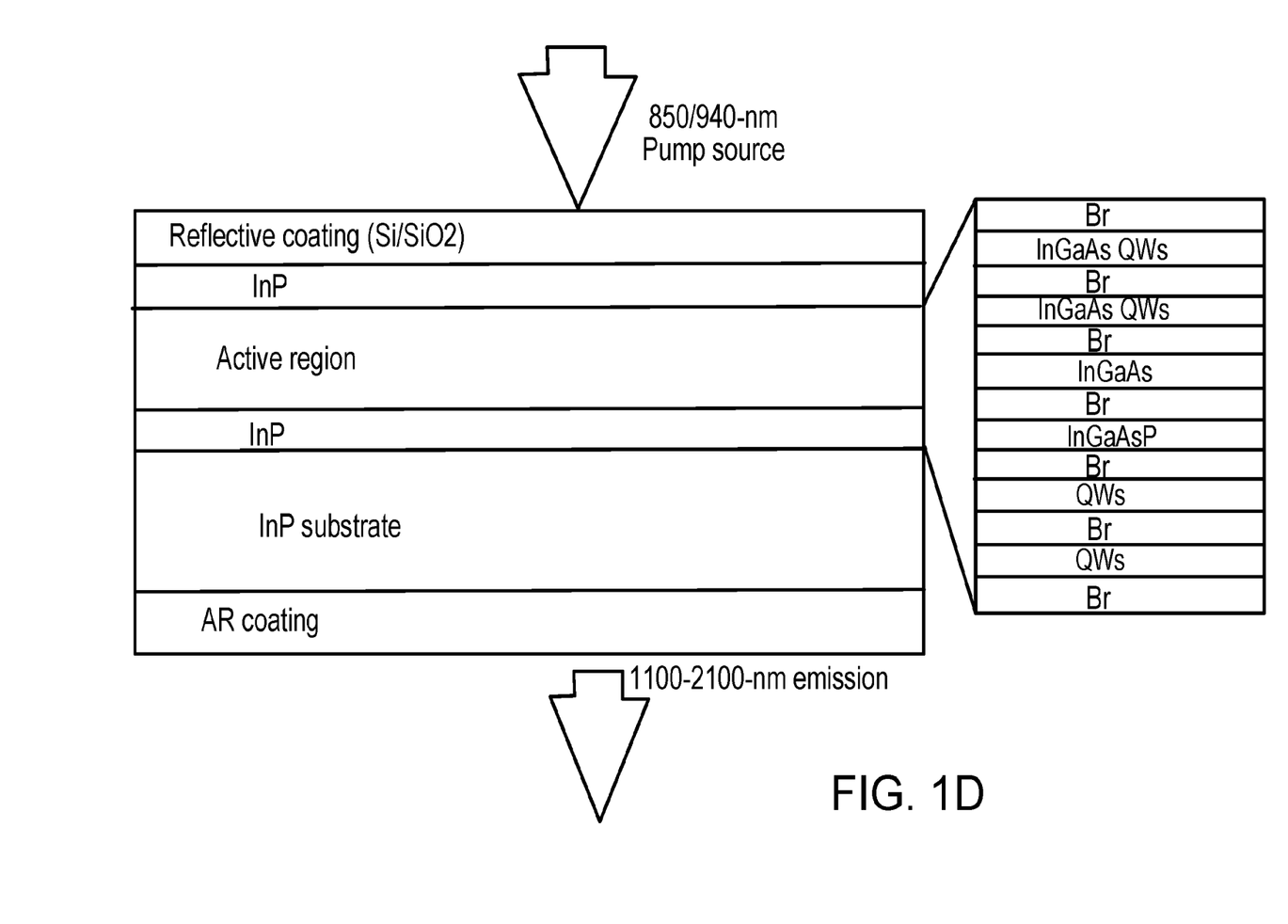
FIG. 1D illustrates a particular example of a broadband emission device.

FIG. 1D illustrates a particular example of a broad-band emitter, including reflective coatings, light-emitting layers and barrier layers. In the illustrated example, the multilayer InP-based structure contains only un-doped layers. All layers are mounted (e.g., grown, deposited) on an InP substrate. Low cost, efficient and high power 850/940-nm commercially-available LEDs can be used as the optical pump source.

Figure 2:
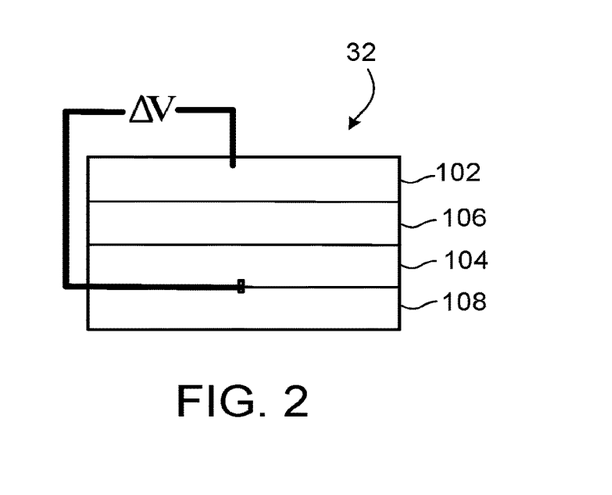
FIG. 2 illustrates an example of a light source for use in the broadband emission device of FIG. 1.

As noted above, the light source 32 can be implemented in various ways. For example, as shown in FIG. 2, the light source 32 can include a large band gap semiconductor layer 106 disposed between p-type and n-type semiconductor layers 102, 104. The p-n junction is driven in forward bias to cause light emission at $\lambda_{E1}$. In some implementations, the light source 32 is operable to generate light having a wavelength $\lambda_{E1}$ of about 850 nm. Other wavelengths for $\lambda_{E1}$ may be appropriate for some implementations. An electrical barrier layer 108 also can be provided in some instances between the light source 32 and the upper transition layer 30. In general, pumping techniques that can be used to stimulate the light emission can include pumping by an external light source, using a lateral p-n junction, or providing a built-in high band gap p-n emitter diode to inject photons into the stack 22.

In some implementations, multiple light sources can be included e.g., one on each side perpendicular to the light-emitting layers. For example, a number of light sources can be included, each with a different wavelength. Thus, two light sources each of which is configured to emit a high-energy wavelength and a low-energy wavelength can increase efficiency in some implementations. For example, referring to FIG. 1, a low-energy wavelength arising from layer 32 may be heavily absorbed by layer 28, but the other layers (i.e., layers 24, 26, 30) may be considerably transparent to the low-energy wavelength. In contrast, a high-energy wavelength arising from layer 32 may be heavily absorbed by layer 24, therefore, little high-energy wavelength light might reach layer 28—such an embodiment can be particularly efficient.

Figure 3:
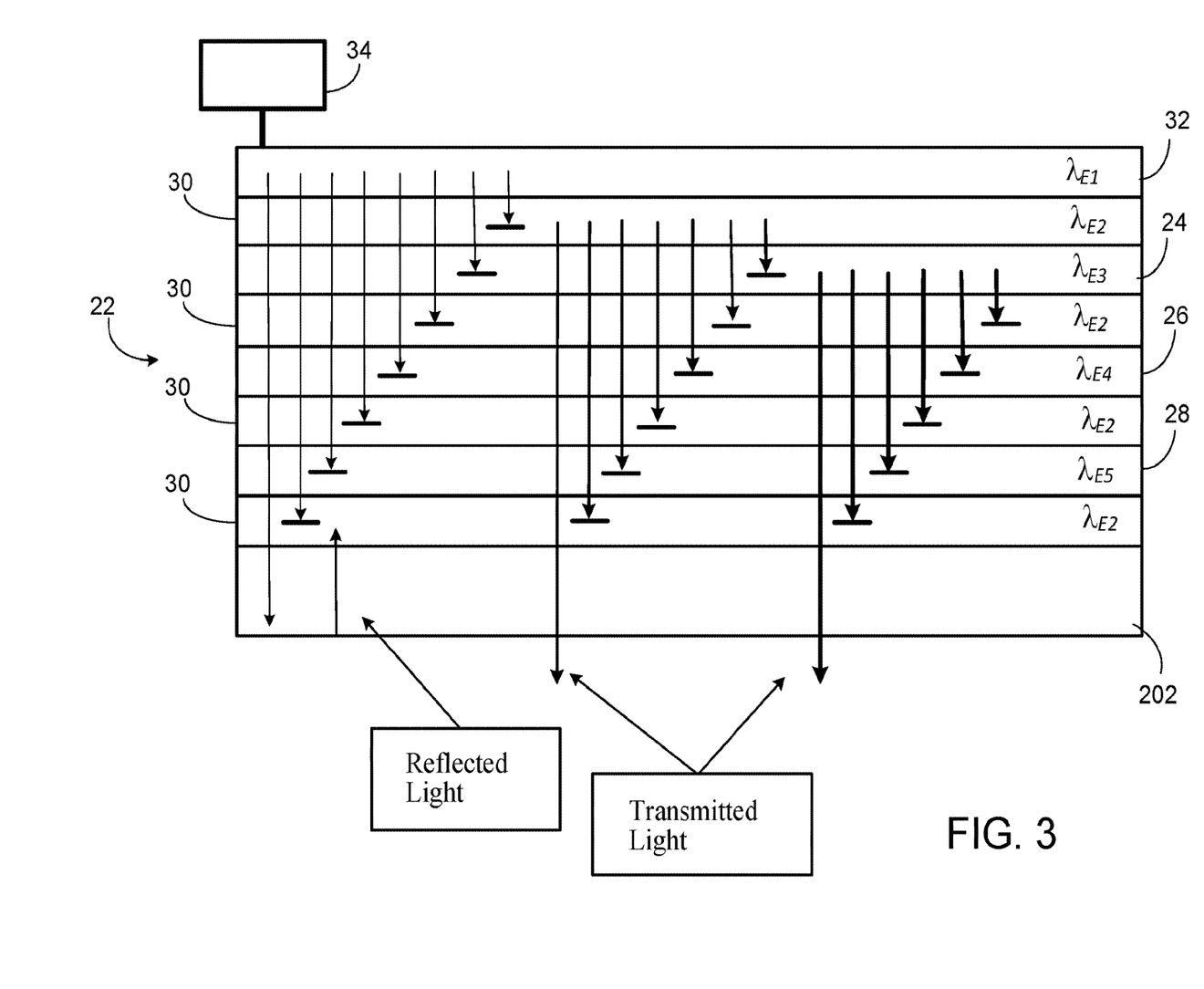
FIGS. 3, 4, 5, 6 and 7 illustrate further examples of broadband emission devices.

FIGS. 3 through 6 illustrate other features that may be present in some implementations. For example, as shown in FIG. 3, the broadband emission device can include a partially reflective layer and/or a distributed feedback element 202. While the partially reflective layer and/or a distributed feedback element 202 allows some of the stimulated emission to pass through to outside the broadband emission device, some of the light is reflected back into the stack 22 so as to stimulate further optical emission at lower wavelengths.

Figure 4:
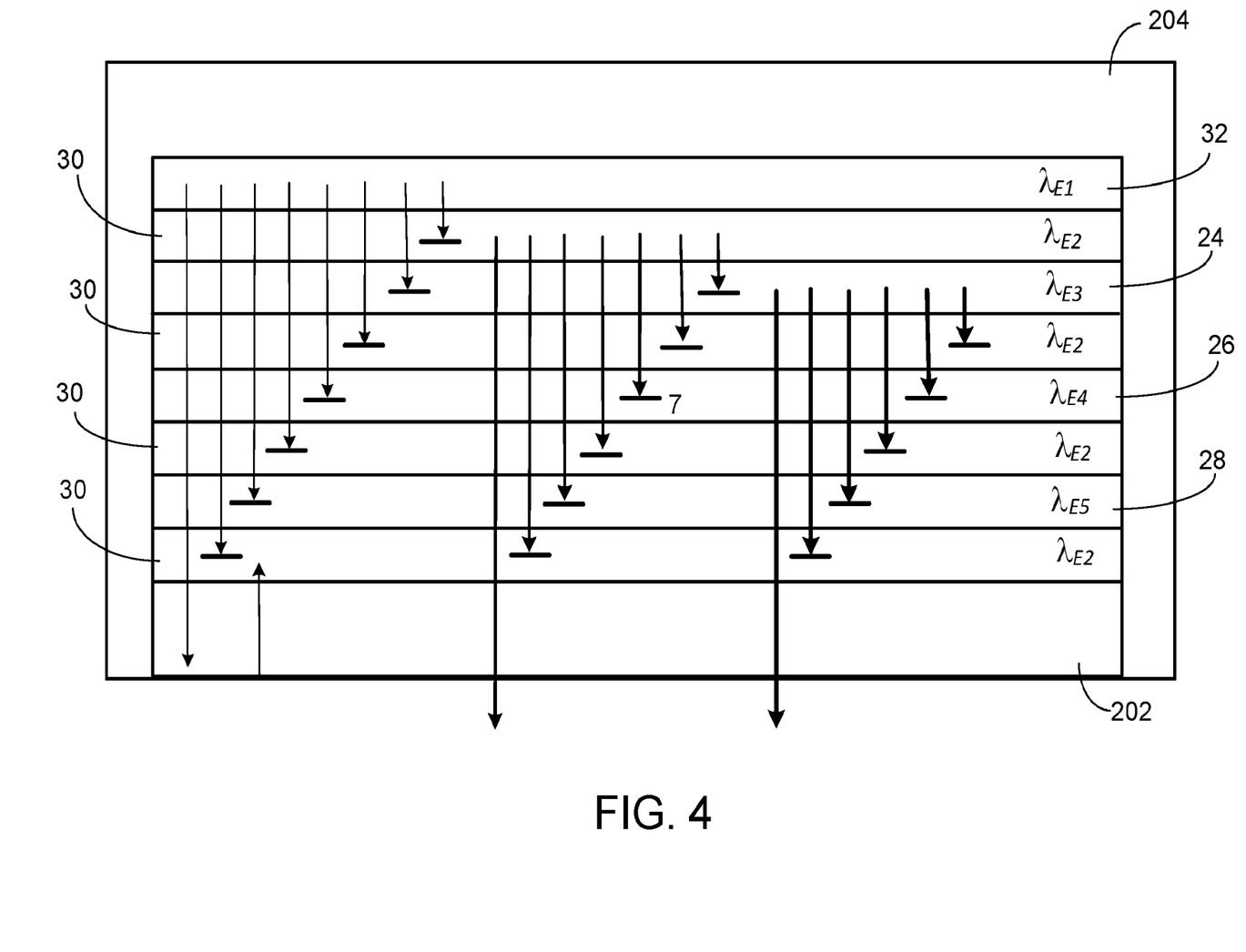
Figure 5:
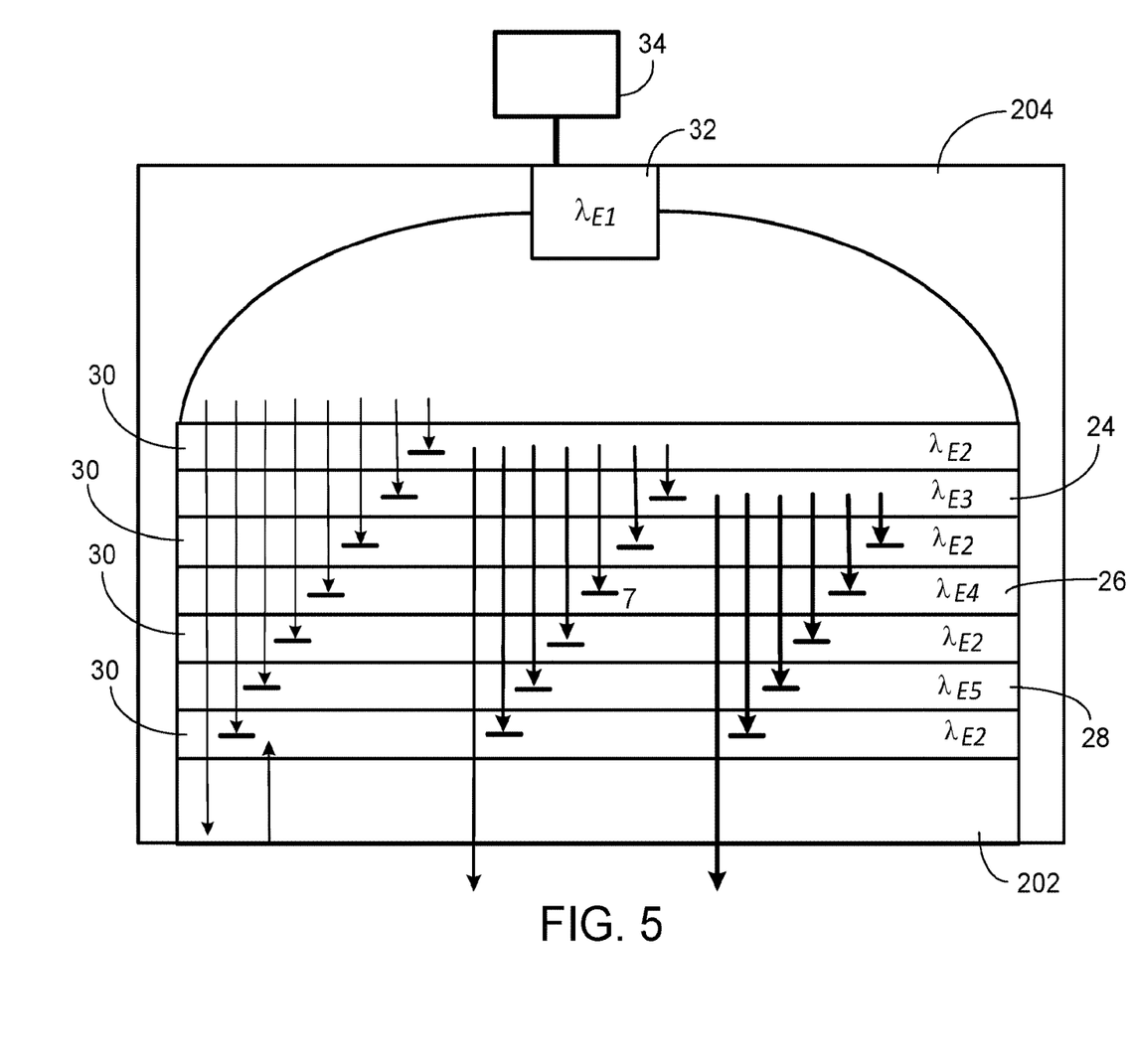
Figure 6:
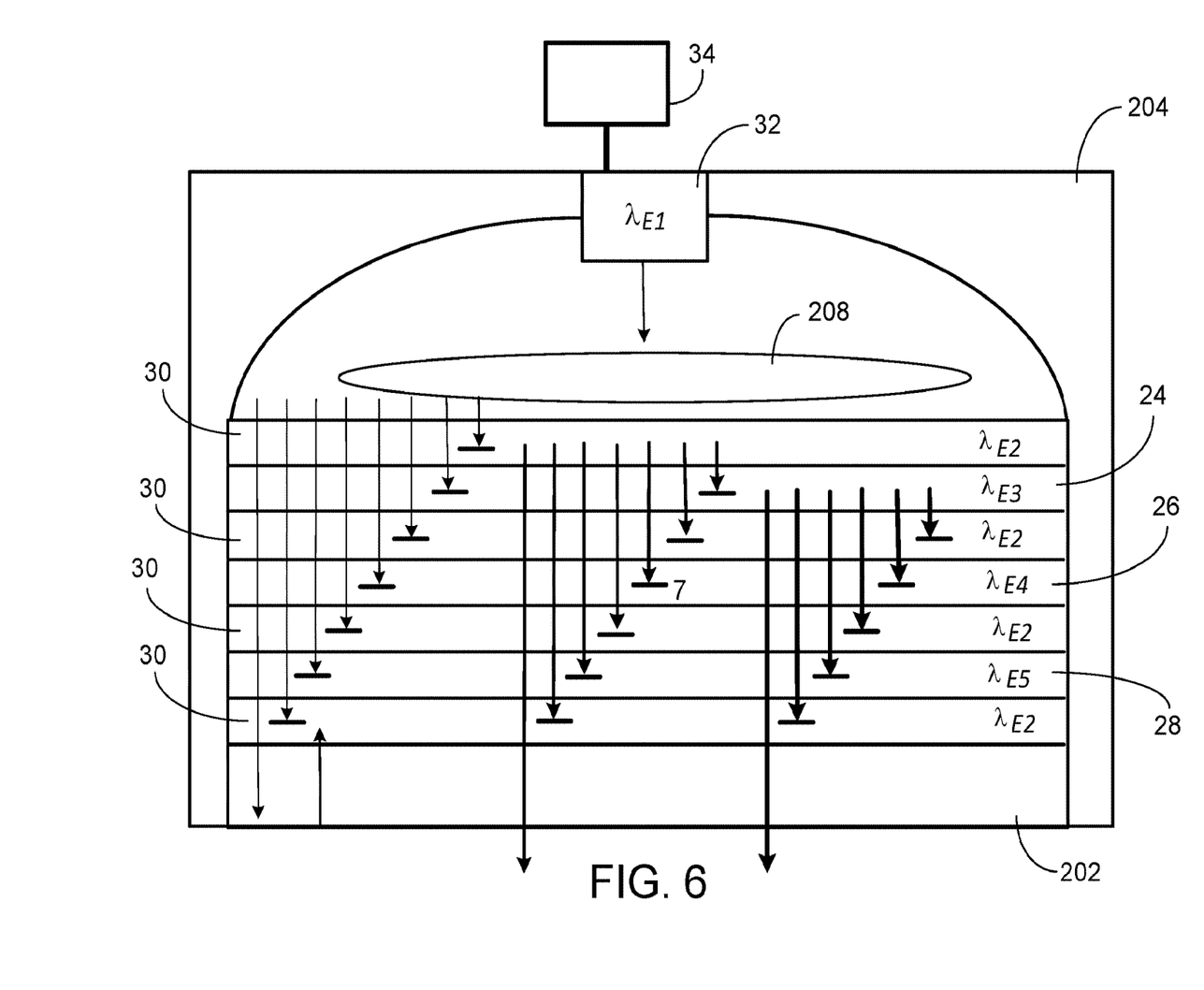

As illustrated in FIG. 4, the broadband emission device also can include, in some implementations, a reflector 204 to help reflect stray light away. Such a reflector may be useful, for example, in instances where the light source 32 is implemented as a light emitting element 32 as shown in FIG. 5. The light emitting element 32 can be, for example, as a high-power light emitting diode (LED), a laser diode, or a vertical cavity surface emitting laser (VCSEL) that is operable to emit light at an energy higher than the band-gap energy of any of the semiconductor light emitting layers 24-28 and transitional layers 30. In some implementation, it can be advantageous to provide an optical assembly 208 to distribute, direct and/or focus light $\lambda_{E1}$ to the first transitional layer 30. The optical assembly 208 can include, for example, one or more diffractive and/or refractive elements.

In some cases, reflective surfaces are provided around light emitting layers 24-28. The reflective layers can be parallel and/or perpendicular to the layers 24-28. Efficiency can be increased, and in some instances, the direction of emission can be tuned to a particular application. For example, an implementation that includes reflective surfaces parallel to the layers can be operable as an edge-emitting device.

In some instances, as described above, the transition layers 30 are only partially transparent to the light emitted by the light source 32. Thus, the transition layers 30 also absorb some of the light and participate in generating the stimulated emission of light. For example, in some implementations light emitted by the light source 32 can generate charge carriers (e.g., holes and electrons) in the transition layers 30. The charge carriers can migrate to any of the light emitting layers 24-28 and recombine, emitting light upon recombination. This feature can be particularly advantageous, for example, if the light emitting layers 24-28 are relatively thin. In some situations, however, the transition layers 30 may have a sufficiently large band gap such that the transition layers 30 are completely transparent to the light of wavelength $\lambda_{E1}$ (e.g., 950 nm) emitted by the light source 32, which allows more light from the light source 32 to reach the subsequent layers 24, 26, 28 in the stack 22A (see arrows 302, 304, 306 in FIG. 7). Some of the light of wavelength $\lambda_{E1}$ from the light source 32 can be absorbed by each of the layers 24, 26, 28, which stimulates light emission in those layers. Further, it can be advantageous in some instances, to place the layer 28, which has the lowest band gap energy (i.e., E5) among the layers 24, 26, 28, closest to the light source 32. In that way, subsequent layers 24, 26 are transparent to light generated by layer 28 at wavelength $\lambda_{E5}$ (see arrow 308).

Figure 7:
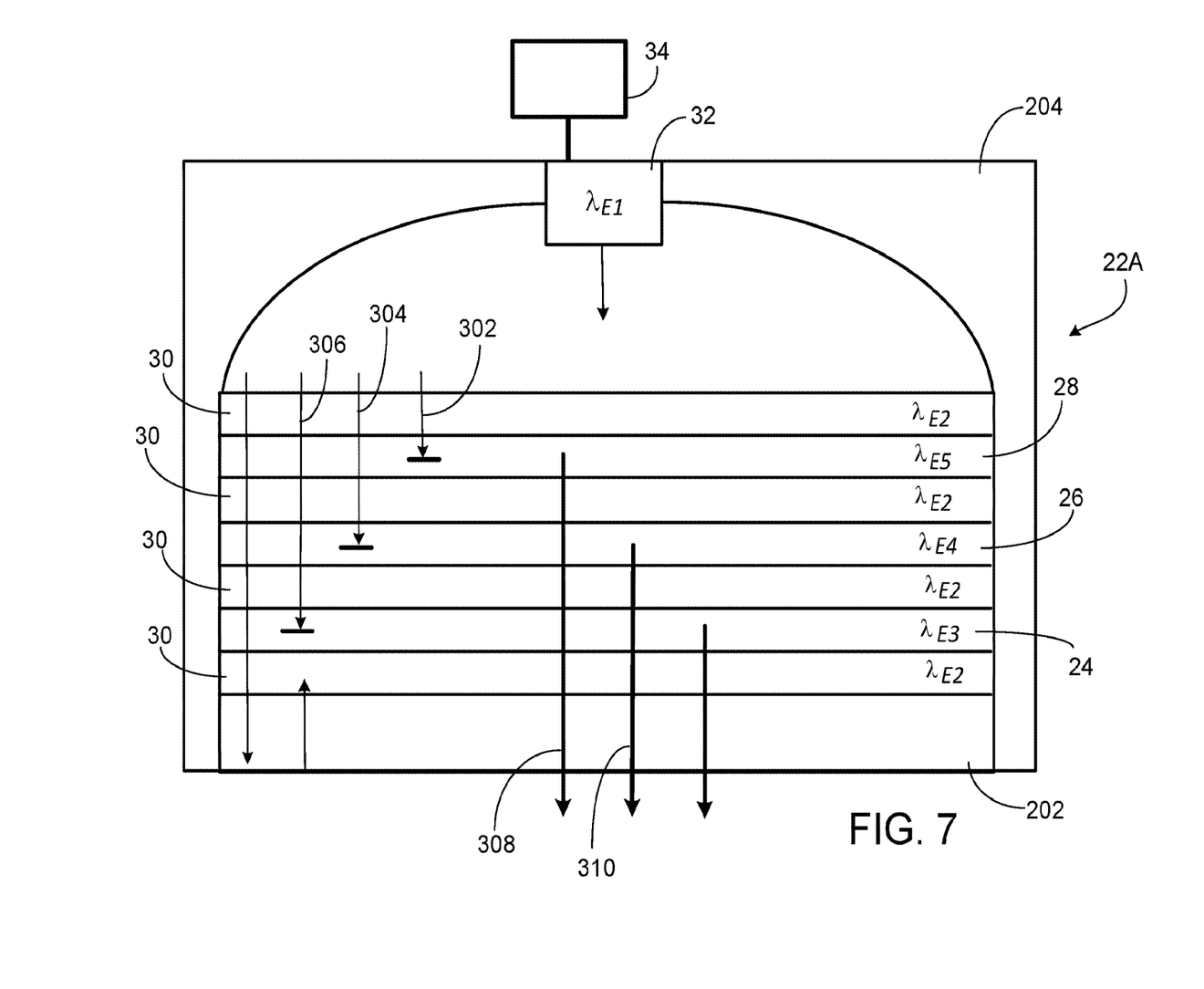

Likewise, layer 24, which has the largest band gap among the layers 24, 26, 28, also is transparent to light generated by layer 26 at wavelength $\lambda_{E4}$ (see arrow 310). Thus, in this example, each layer in the stack 22A is transparent to light generated by each of the preceding layers in the stack 22A. Such an arrangement can result in more efficient emission in some cases.

In some implementations, it also can be beneficial to provide different thicknesses for the various light emitting layers 24, 26, 28. For example, layers further from the light source 32 can be made thicker than layers closer to the light source so as to increase the amount of light from the light source 32 that is absorbed by the more distance layers compared to what otherwise would be absorbed. Thus, in some implementations of the arrangements of FIGS. 1 and 3-6, the layer 28 may be thicker than the layer 26, which in turn may be thicker than the layer 24. Similarly, in some implementations of the arrangements of FIG. 7, the layer 24 may be thicker than the layer 26, which in turn may be thicker than the layer 28.

The foregoing broadband optical emission sources can be integrated, for example, into spectrometers having a wide range of different arrangements. In general, such the broad spectrum emission source can produce a wide-spectrum beam at least a portion of which is incident on a sample whose properties are to be analyzed. An example of the sample is an organic molecule, although other types of samples can be analyzed as well. Typically, the sample absorbs certain wavelengths of light, whereas it may allow other wavelengths to pass through or may reflect some wavelengths. By analyzing the wavelengths that are absorbed, reflected and/or transmitted, various properties of the sample can be identified (e.g., characteristics of a chemical bond between atoms in the organic molecule).

Figure 8A:
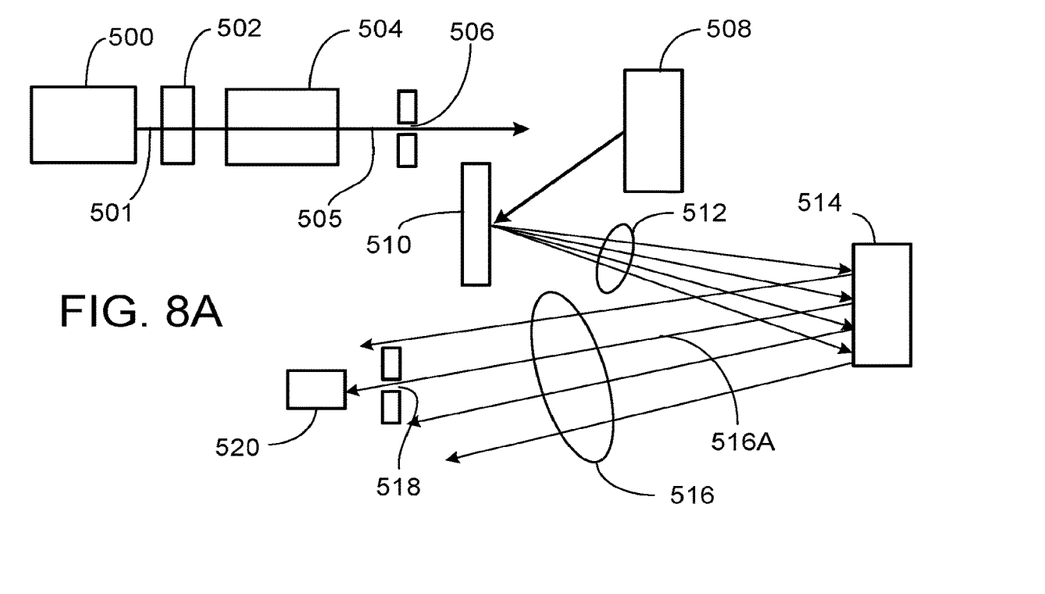
FIGS. 8A and 8B illustrate an example of a spectrometer including a broadband optical emission device.
Figure 8B:
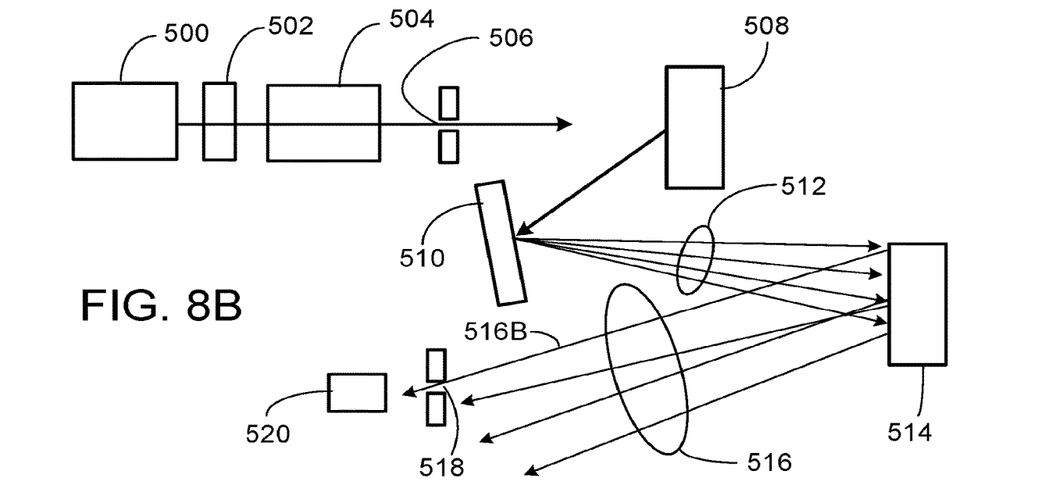

A first example of a spectrometer using a broadband emission source as described above is illustrated in FIGS. 8A and 8B. In this example, the spectrometer includes a broadband emission source 500 that emits a broadband beam of light 501. The broadband emission source 500 can be implemented by any of the broadband sources described above. The beam 501 can pass through an optical assembly 502 and a sample 504 whose properties are to be analyzed. The light 505 that passed through the sample 504 passes through a first slit 506 and is incident on a first focusing mirror 508. The mirror 508 reflects the light toward a rotatable diffraction grating 510, which splits the beam into its spectral components 512, each of which has a different wavelength (or narrow range of wavelengths). The beams 512 are incident on a second focusing mirror 514 which reflects beams 516. Depending on the position of the diffraction grating 510, a particular one of the beams passes through a second slit 518 and impinges on a light detector 520 (e.g., a photodiode). For example, when the diffraction grating 510 is in a first position, a beam 516A representing a particular spectral component (i.e., wavelength) passes through the slit 518 and is detected by the detector 520 (FIG. 8A). When the diffraction grating 510 is in a second position, a beam 516B representing a different spectral component (i.e., wavelength) passes through the slit 518 and is detected by the detector 520 (FIG. 8B). By changing the position of the grating 510, other ones of the spectral components can be detected. The detected spectral components can be processed and analyzed to identify properties of the sample 504.

In some instances, the rotatable diffraction grating 510 can be replaced by a fixed diffraction grating. Further, the second slit 518 and point detector 520 can be replaced by an array light detector. Such an arrangement can allow the various spectral components 516 to be detected by the array detector at the same time.

To improve the compactness of the spectrometer and/or to increase the total amount of light intensity that is incident on the detector, alternative spectrometer arrangements are possible. For example, some cases can avoid spatially separating the different wavelengths (or narrow ranges of wavelengths), which then travel along different paths. Further, in some instances, the reduction in light intensity resulting from the temporal or spatial selection of only a small wavelength range from the original wide spectrum can be avoided.

Figure 9:
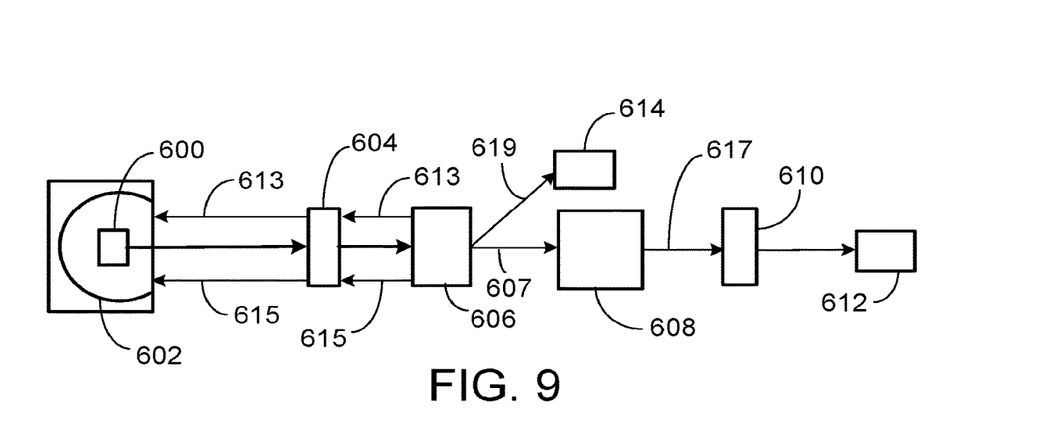
FIGS. 9, 10, 11 and 12 illustrate additional examples of spectrometers including a broadband optical emission device.

For example, as shown in FIG. 9, in some implementations, the spectrometer includes a tunable wavelength filter 606 that allows only selected wavelengths (or ranges of wavelength) of light 607 to pass to the sample 608. Other wavelengths of light 613, 615 are reflected back toward the broadband source 600. The source 600 can include a parabolic or other reflector 602 to help keep stray light away and/or direct light from the externally-powered light source toward the broadband source's semiconductor layer stack.

The spectrometer shown in FIG. 9 also includes a first optical assembly 604 disposed between the broadband source 600 and the filter 606. The optical assembly 604 can help focus or collimate the light emitted by the source 600 and, in some cases, may have a divergence of only 10-20 degrees. Light 617 of the selected wavelength (or range of wavelengths) passing through the sample 608 can then pass through a second optical assembly 610 before being detected, for example, by a sample light detector (e.g., photodiode) 612. In some instances, some of the light 619 passing through the filter 606 can be directed, for example by a prism or mirror, to a reference light detector 614, which can be used to confirm that wavelength of light being passed by the filter 606. The filter 606 can be tuned to pass light of different wavelengths (or narrow ranges of wavelength, e.g., ±10 nm about a central wavelength) at different instances of time to allow the different wavelengths of light to be incident on the sample 608. By detecting the light incident on the detector 612, an absorbance (or transmittance/reflectance) spectrum for the sample 608 can be obtained.

For the implementation of FIG. 9, although any broadband source can be used, the particular broadband sources described in FIGS. 1-7 can be particularly advantageous. In some case, however, the broadband source 600 does not include the reflector 602.

Figure 10:
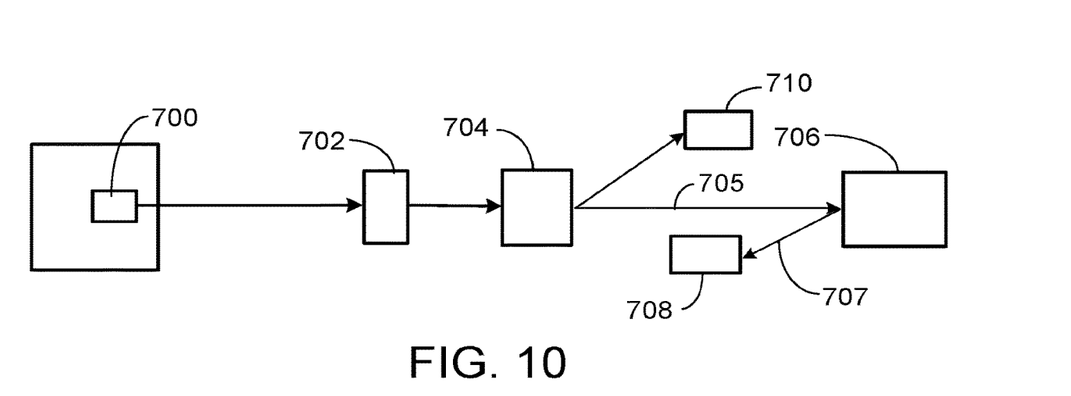

The foregoing examples of FIGS. 8A-8B and 9 operate in a transmittance mode, in which light passing through the sample to-be-analyzed is detected. Other instances may operate in a reflectance mode, in which light reflected by the sample to-be-analyzed is detected. An example is illustrated in FIG. 10, which shows a broadband emission source 700 which emits light through an optical assembly 702 toward a tunable wavelength filter 704. Light 705 passing through the filter 704 is incident on the sample 706, which reflects or re-emits some light 707, for example, toward a sample light detector 708 (e.g., photodiode). In some instances, some of the light passing through the filter 704 can be directed, for example by a prism or mirror, to a reference light detector 710, which can be used to confirm that wavelength of light being passed by the filter 704. The filter 704 can be tuned to pass light of different wavelengths (or narrow ranges of wavelength, e.g., +10 nm about a central wavelength) at different instances of time to allow the different wavelengths of light to be incident on the sample 706. Once again, by detecting the light incident on the detector 708, an absorbance (or transmittance/reflectance) spectrum for the sample 706 can be obtained.

Figure 11:
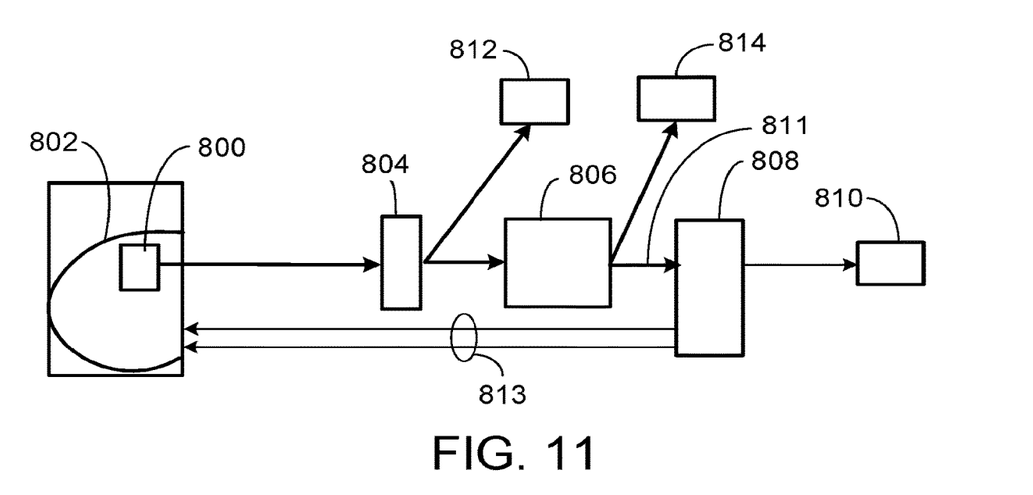

In the foregoing examples, light emitted by the broadband source passes through a wavelength filter before impinging on the sample. In some implementations, the wavelength filter can be disposed in part of the light path after the light passes through or is reflected by the sample. For example, FIG. 11 illustrates a spectrometer that operates in a transmissive mode. Light emitted by the broadband emission source 800 passes through an optical assembly 804 and is incident on a sample 806. Thus, a wide range of wavelengths can be incident on the sample 806 at the same time. Light 811 passing through the sample 806 is incident on a tunable wavelength filter 808, which allows only a selected wavelength (or narrow range of wavelengths) to pass to the light detector (e.g., photodiode) 810. The filter 808 can be tuned to pass light of different wavelengths (or narrow ranges of wavelength, e.g., +10 nm about a central wavelength) at different instances of time to allow the different wavelengths of light to be sensed by the detector 810. By detecting the light incident on the detector 810, an absorbance (or transmittance/reflectance) spectrum for the sample 806 can be obtained.

In some cases, wavelengths of light 813 reflected by the filter 808 can be incident on a reflector 802 associated with the broadband source 800. The reflected light 813 thus can help stimulate further optical emission in the broadband source 800. Also, reference light can be samples at one or more positions along the light path. For example, one or more reference light detectors 812, 814 can be provided to sense, respectively, some of the light passing through the optical assembly 804 and/or passing through the sample 806 prior to its passing through the filter 808. Optical components such as mirrors and/or prisms can be used to direct some of the light toward the detectors 812, 814.

Figure 12:
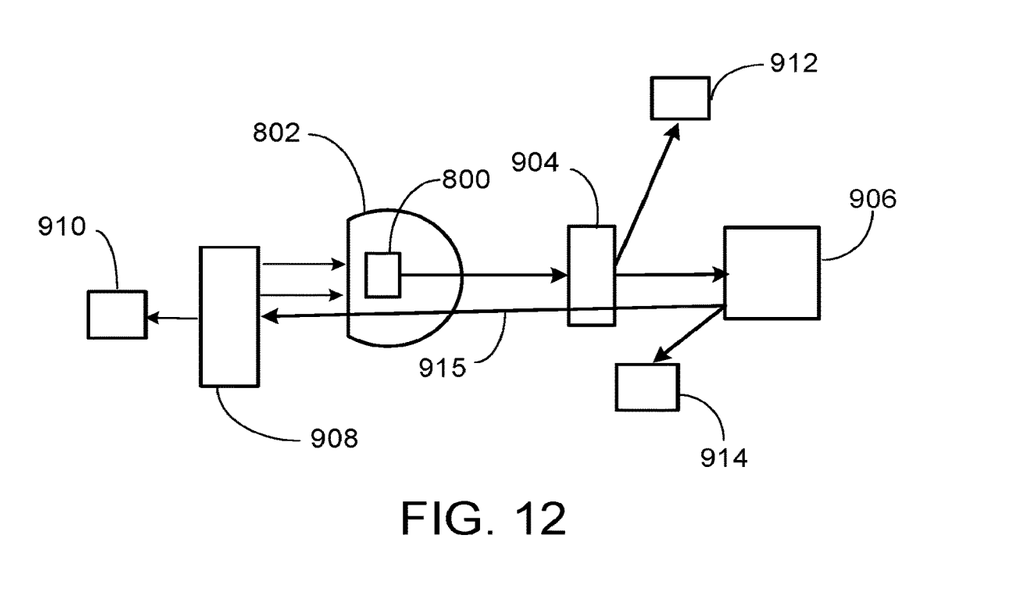

Whereas FIG. 11 illustrates a spectrometer operable in a transmittance mode, FIG. 12 illustrates an example of a spectrometer operable in a reflectance mode. The spectrometer of FIG. 12 includes a tunable wavelength filter 908 disposed in part of the light path after the light is reflected by the sample 906. The arrangement illustrated in FIG. 12 also includes an optical assembly 904 that can help focus or collimate the light onto the sample 906. Light 915 reflected by the sample 906 is directed toward the wavelength filter 908. Light of the wavelength (or range of wavelengths) selected by the filter 908 then is detected by a sample light detector (e.g., photodiode) 910. As in other embodiments described above, the spectrometer of FIG. 12 can include one or more reference light detectors 912, 914 to sense, respectively, some of the light passing through the optical assembly 904 and/or reflected by the sample 906 prior to its passing through the filter 908. Optical components such as mirrors and/or prisms can be used to direct some of the light toward the detectors 912, 914.

In the various spectrometer implementations described above, the wavelength filter can be implemented, for example, as a Fabry Perrot filter (e.g., a scanning MEMS or linear variable Fabry Perrot filter). Other types of optical wavelength filters also may be used. Nevertheless, a Fabry Perrot filter can help achieve a more compact spectrometer.

Further, recovering some or all of the light that is not passed by the wavelength filter, by directing the light back toward the broadband emission source, can help increase the overall amount of optical stimulation that takes place. Such arrangements can help improve the energy efficiency of the spectrometers.

The various spectrometers described above can include processing circuitry (e.g., a microprocessor or other logic) to analyze signals from the light detector. The signals can be analyzed to determine various properties of the sample based on the wavelengths of light transmitted through the sample, absorbed by the sample, and/or reflected by the sample.

Various modifications can be made within the spirit of this disclosure. Accordingly, other implementations are within the scope of the claims.

What is claimed is:

1. A spectrometer comprising:
    a broadband optical emission device including a light source operable to be driven so as to generate stimulated optical emission from the broadband optical emission device;
    a tunable wavelength filter operable to allow a selected wavelength or range of wavelengths of light from the broadband optical emission device to be incident on a sample, wherein other non-selected wavelengths or ranges of wavelengths of light are reflected back by the tunable wavelength filter toward the broadband optical emission device to generate further stimulated optical emission; and
    a light detector operable to sense optical signals based on a portion of the light that passes through the sample or is reflected by the sample.

2. The spectrometer of claim 1, wherein the tunable wavelength filter comprises a Fabry Perrot filter.

3. The spectrometer of claim 1 wherein the filter comprises a scanning MEMS filter.

4. The spectrometer of claim 1 wherein the filter comprises a linear variable Fabry Perrot filter.

* * * * *